United States Patent [19]

Ninomiya et al.

[11] Patent Number: 4,663,208
[45] Date of Patent: May 5, 1987

[54] PRINTED CIRCUIT BOARD AND METHOD OF MANUFACTURING SAME

[75] Inventors: Takeshi Ninomiya, Chigasaki; Risuke Ozaki, Kokubunji, both of Japan

[73] Assignee: O. Key Printed Wiring Co., Ltd., Tokyo, Japan

[21] Appl. No.: 691,611

[22] Filed: Jan. 15, 1985

[30] Foreign Application Priority Data

Jan. 17, 1984 [JP] Japan .................................. 59-4677

[51] Int. Cl.⁴ ........................ B32B 3/10; B32B 31/00; B22F 5/00; H05K 1/00
[52] U.S. Cl. ..................................... 428/138; 29/852; 156/153; 156/252; 156/306.9; 156/313; 156/902; 174/68.5; 427/97; 428/596; 428/601; 428/901
[58] Field of Search ........................ 174/68.5; 427/97; 29/831, 846, 852; 428/596, 601, 137, 138, 901; 156/153, 252, 306.9, 313, 902

[56] References Cited

U.S. PATENT DOCUMENTS 3,259,805  7/1966  Osipchak et al. ............... 156/901 R
3,334,395  8/1967  Cook et al. ............................ 29/852
3,514,538  5/1970  Chadwick et al. ............. 156/901 X
3,613,230  10/1971  Griff ................................. 156/629 X
4,075,757  2/1978  Malm et al. ..................... 156/902 X
4,478,884  10/1984  Barnes et al. ...................... 29/852 X
4,522,667  6/1985  Hanson et al. .................. 156/634 X Primary Examiner—William A. Powell
Attorney, Agent, or Firm—Birch, Stewart, Kolasch & Birch

[57] ABSTRACT

The present invention relates to a printed circuit board and to a method of manufacturing the same.

The printed circuit board of the present invention consists of a metal board glued to a resin board which is provided with at least one circuit layer. The metal board is provided with holes which are filled with resin, and lead wire holes are provided at the centers of the resin filled holes. The resin board is provided with through holes. The center of the lead wire holes and the centers of the through holes are on identical lines.

Further, the method of manufacturing a printed circuit board under the present invention is to provide resin holes on a metal board, filling the holes with resin, and providing lead wire holes at the centers of the resin filled holes. In this process, an identical hole position designating means is used for providing the resin holes and the lead wire holes. At least one circuit layer and through holes are to be provided on the resin board. Thereafter, the metal board and the resin board are glued together. In this process, the centers of the lead wire holes and the centers of the through holes are to be put on identical lines.

10 Claims, 15 Drawing Figures

FIG. 2d
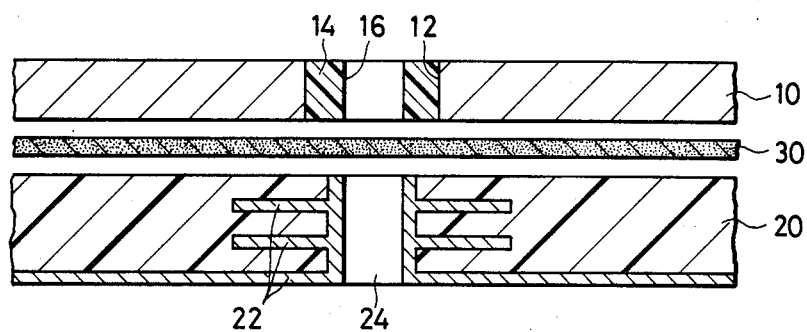
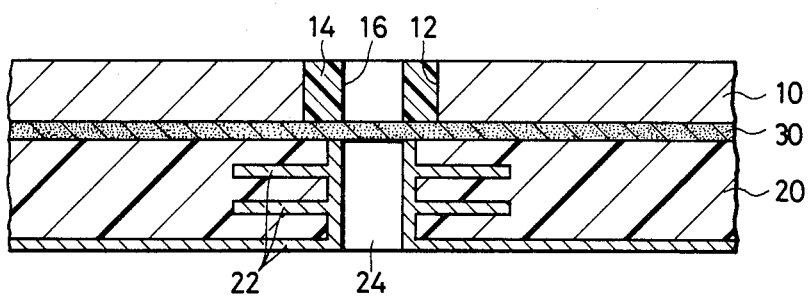
FIG. 2e

FIG. 4d
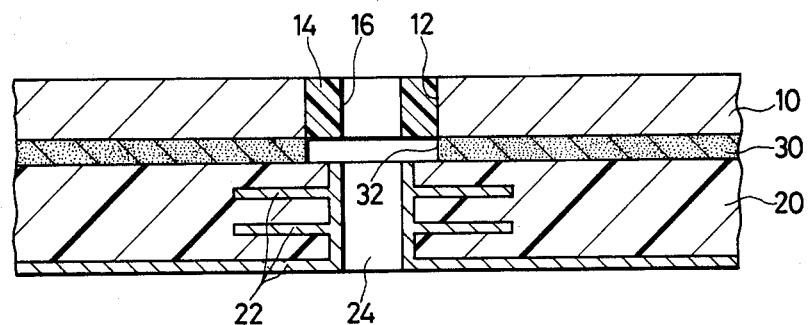
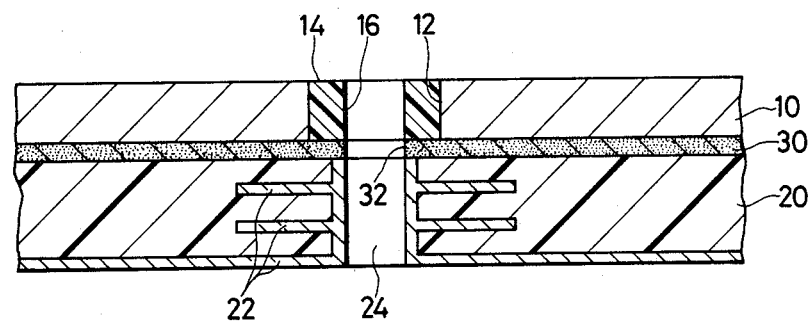
FIG. 4e

PRINTED CIRCUIT BOARD AND METHOD OF MANUFACTURING SAME

BACKGROUND OF THE INVENTION

1. Field of the Invention

The present invention relates to a printed circuit board and to a method of manufacturing the same.

2. Description of the Prior Art

So far there have been provided printed circuit resin boards having at least a circuit layer formed on the resin board. As the miniaturization of electronic components progresses, however, the growing density of components mounted on the printed circuit board increases the heat generated from these mounted components and one big problem to be solved now is deteriorating performance of these mounted components which derives from a higher temperature in the adjacent area of the printed circuit board as a result of an insufficient heat releasing capacity of these printed circuit resin boards. To cope with this, components provided with radiation fins have been mounted on the board, but, a drawback in this case has been a higher cost of mounted components. As the number of mounted components increases, the printed circuit board becomes cambered due to a lessening in the flexural rigidity of the printed circuit resin board, which makes it impossible to be incorporated into on electronic system. Even if it could be incorporated, it comes in contact with neighboring printed circuit boards and occasionally seriously jeopardizes the circuit function. Moreover, generation of noize cannot be avoided, as the printed circuit resin board has a poor shielding effect.

SUMMARY OF THE INVENTION

The objective of the present invention is to offer a printed circuit board having a better heat releasing capacity, larger flexural rigidity and improved shielding effect and a method of manufacturing the same.

The printed circuit board of the present invention is characterized in that a metal board and a resin board are glued together, holes which are filled with resin are opened through the metal board and lead wire holes are provided through the centers of the filled resin holes. At least one circuit layer and through holes are provided on the resin board and the centers of the lead wire holes and the centers of the through holes are kept on identical lines. Further, the method for manufacturing the printed circuit board of the present invention is characterized in that resin holes are provided through a metal board by a drilling machine or a press machine by applying a hole position designating means, filling the resin holes with resin, and providing lead wire holes through the centers of the filled resin holes by a drilling machine applying the hole position designating means, and further providing at least a circuit layer and through holes on a resin board gluing together the metal board and the resin board while keeping the centers of the lead wire holes and the centers of the through holes on identical lines.

DETAILED DESCRIPTION OF THE INVENTION

Figure 1:
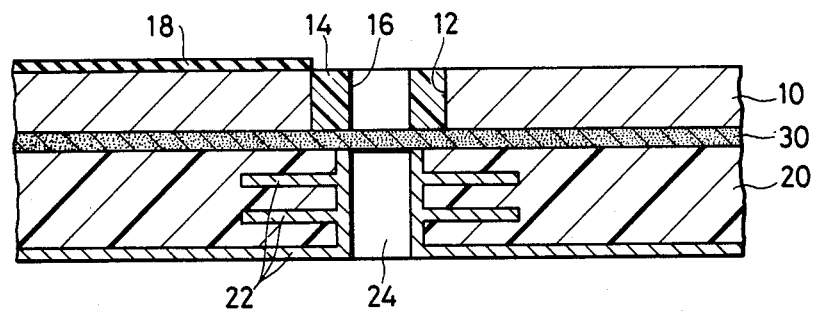
FIG. 1 shows a cross-sectional view of a part of the printed circuit board of the present invention.

Based on FIG. 1, a preferred embodiment of the printed circuit board of the present invention is explained in detail hereafter. An aluminum board 10 and a resin board 20 are glued together by a prepreg 30. The holes 12 which are filled with resin 14 are opened through the aluminum board 10 and lead wire holes 16 are provided at the centers of the filled resin 14, while a part of the surface of the aluminum board 10 is coated with a insulation membrane 18. The resin board 20 is provided with circuit layers 22 and through holes 24 connected with the circuit layers 22. Further, as the prepreg 30 is made of soft material, when the lead wire of the mounted component is inserted through the lead wire hole 16, the lead wire can easily penetrate through the prepreg 30 into the through hole 24.

The printed circuit board, as a resin board 20 provided with the circuit layers 22 glued to the aluminum board 10, has a better heat releasing capacity and a larger flexural rigidity with an excellent shielding effect. In addition, as it employs an aluminum board 10 as the metal board, it does not contribute to increase the weight of the printed circuit board.

Figure 2A:
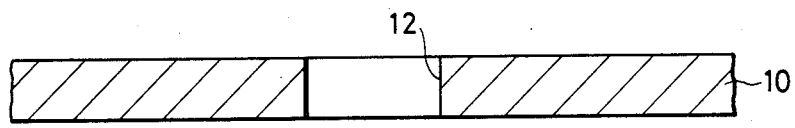
FIG. 2 explains the method for manufacturing the printed circuit board of the present invention as shown in FIG. 1.
Figure 2B:
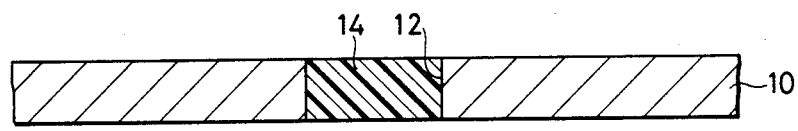
Figure 2C:
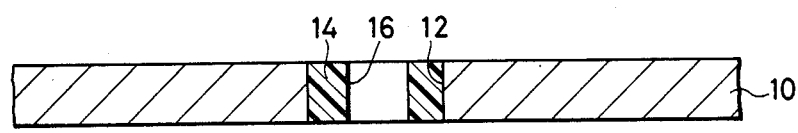

Next, the method for manufacturing the printed circuit board shown in FIG. 1 is explained according to FIG. 2. First, an NC (numerical control) tape which contains the data for the positions of the centers of the lead wire holes 16 is prepared by NC designing or a draft film. Next, the aluminum board 10 is fixed at the designated position on an NC drilling machine which drills the holes in compliance with the directions given by the NC tape, and after attaching the first drill to the drilling machine the resin holes 12 are drilled through the aluminum board 10 by the drilling machine (FIG. 2(a)). Next, resins 14 are filled in the resin holes 12 by means of silk-screen printing or roller after taking the aluminum board 10 off of the drilling machine and then the resin 14 is hardened by heat drying or ultraviolet rays (FIG. 2(b)). Next, the aluminum board 10 is fixed again at the aforesaid designated position on the aforesaid drilling machine, and simultaneously after attaching the second drill the diameter of which is smaller than that of the first drill to the aforesaid NC drilling machine, the lead wire holes 16 are drilled through the center of the filled resin 14 by the aforesaid drilling machine under the directions of the aforesaid NC tape (FIG. 2(c)). Next, the prepreg 30 is placed between the aluminum board 10 and the resin board 20 on which the circuit layers 22 and the through holes 24 are provided (FIG. 2(d)). Next, the aluminum board 10 and the resin board 20 are pressed together by heat so as to place the centers of the lead wire holes 16 and the centers of the through holes 24 on identical lines (FIG. 2(e)). Finally, after providing the insulation membrane 18 at the required place or places on the surface of the aluminum board 10 by printing, a finishing processing is necessary to complete its outer configuration.

In this manufacturing method, the drilling operation can be performed with the utmost facility and the lead wire holes 16 can be drilled at the centers of the resin holes 12 with the highest precision, since the resin holes 12 and the lead wire holes 16 are provided by use of the identical NC tape, with specific attention being paid to keeping the center lines of the resin holes 12 and the center lines of the lead wire holes 16 identical.

Figure 3:
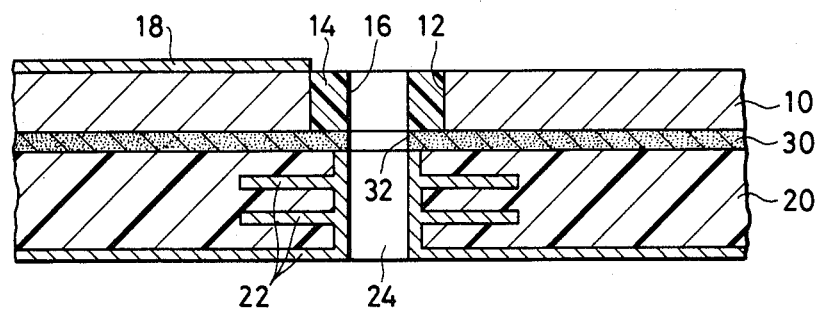
FIG. 3 shows a cross-sectional view of a part of another printed circuit board of the present invention.

FIG. 3 shows another type of the printed circuit board of the present invention. In this printed circuit board, the prepreg 30 has holes 32 the centers of which are on the identical lines that run through the centers of the lead wire holes 16 and the through holes 24, while the remaining features are the same to those of the printed circuit board shown in FIG. 1.

Figure 4A:
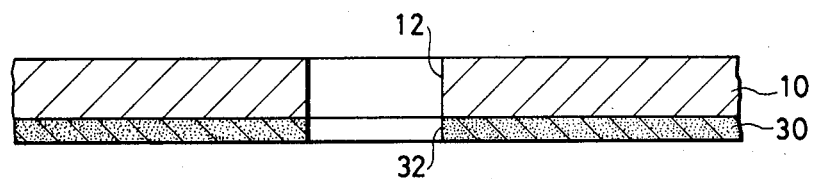
FIG. 4 explains the method for manufacturing the printed circuit board of the present invention as shown in FIG. 3.
Figure 4B:
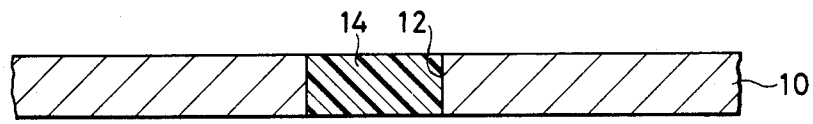
Figure 4C:
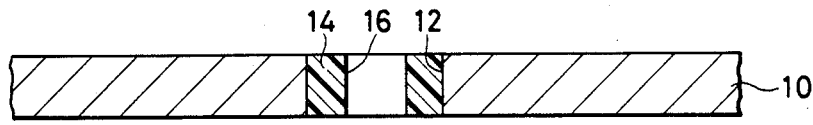

Next, the method for manufacturing the printed circuit board shown in FIG. 3 is described. First, an NC tape which holds the data for the center positions of the lead wire holes 16 is prepared, and then a press die is made by using that NC tape. Next, the aluminum board 10 to which the prepreg 30 is attached is fixed at the designated position on the press machine, and the resin holes 12 and the holes 32 are opened by processing them through the press machine with the aforesaid press die (FIG. 4(a)). Next, after taking the aluminum board 10 and the prepreg 30 off from the press machine, resins 14 is filled in the resin holes 12 and then the filled resins 14 is hardened (FIG. 4(b)). Next, the aluminum board 10 is firmly mounted at the designated position on the NC drilling machine which drills the holes in accordance with the directions given by the aforesaid NC tape, and the lead wire holes 16 are drilled at the centers of the filled resin 14 by the aforesaid NC drilling machine by using the aforesaid NC tape (FIG. 4(c)). Next, the prepreg 30 is inserted in between the aluminum board 10 and the resin board 20 on which the circuit layers 22 and the through holes 24 are provided, so as to put the centers of the lead wire holes 16, the through holes 24 and the holes 32 on identical lines (FIG. 4(d)), and next, to heat press them together by the press machine (FIG. 4(e)). By this pressing operation, the diameters of the holes 32 of the prepreg 30 get smaller. Finally, its outer configuration is finished after putting the insulation membrane 18 at the required position on the surface of the aluminum board 10 by printing.

Furthermore, although the aluminum board 10 is employed as a metal board in the aforementioned preferred embodiment, any kinds of metal board, e.g. iron, copper or aluminum alloy boards can be used as a metal board; an iron board saves the cost and a copper board makes the heat releasing capacity quite better, while an aluminum alloy board turns the weight lighter. Also, for the resin board 20, such boards as made of glass-epoxy, polyimide, and the like can be employed. Further, the metal board can be of a larger dimension than the resin board 20 and in this case the heat releasing capacity can be greatly improved. In addition, by subjecting the board to a bending processing under heat, its cross-section can be made into an L shape or square-groove shape or it can be made into a box shape, in which case it enhances the holding function, shielding function and circuit protective function of the printed circuit board. Although, the aluminum board 10 is glued to the resin board 20 by the prepreg 30, in the alternative the aluminum board 10 can well be glued to the resin board 20 by an adhesive.

Figure 5A:
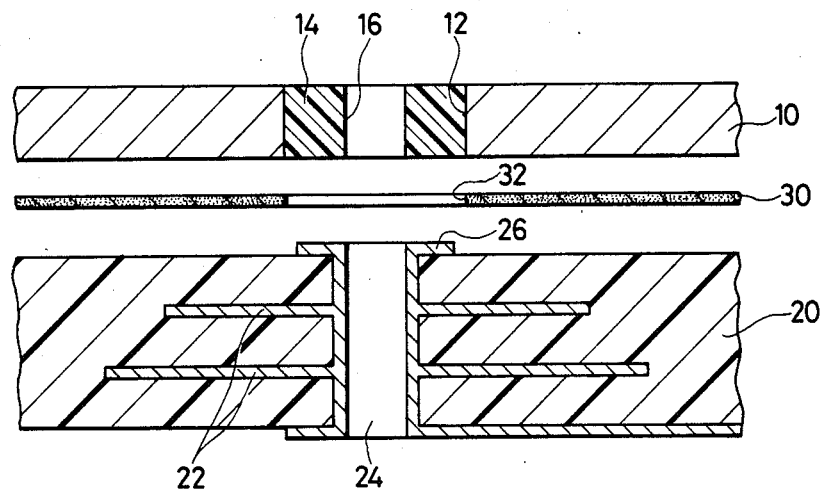
FIG. 5 explains the method for manufacturing another printed circuit board of the present invention.
Figure 5B:
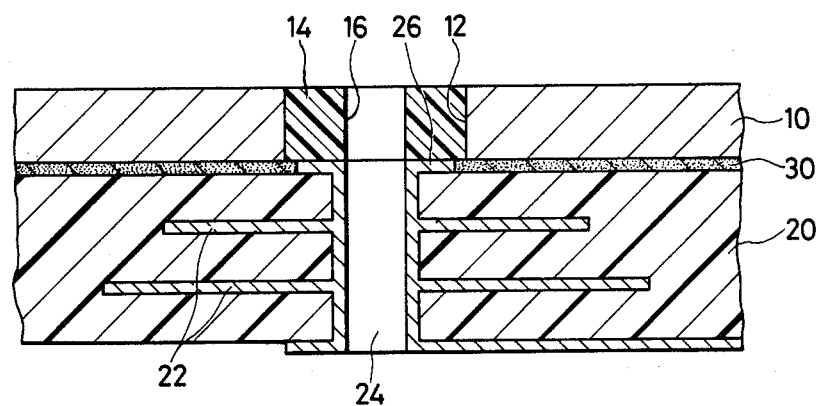

Further, in the above-mentioned preferred example, while an NC drilling machine is used to provide the resin holes 12 in manufacturing the printed circuit board shown in FIG. 1 and a press machine is employed for providing the resin holes 12 and the holes 32 in the manufacture of the printed circuit board shown in FIG. 3, the resin holes 12 can well be made by a press machine in manufacturing the printed circuit board of FIG. 1 and the resin holes 12 and the holes 32 can well be drilled through by an NC drilling machine for the manufacture of the printed circuit board shown in FIG. 3. Also, in the aforesaid preferred example, an NC tape is used as a means for designating the position of each hole, but instead any other hole position designating means can well be applied. Furthermore, if the surface of the aluminum board 10 is roughened by means of mechanical treatment or such an electrical treatment as an anodic oxidation prior to opening the resin holes 12 on the aluminum board 10, its heat releasing capacity and adhesiveness can be improved. Additionally, as shown in FIG. 5(a), should the conductive layer 26 be formed in the area adjacent to the through holes 24 on the side of the resin board 20 where the aluminum board 10 is glued, it prevents the prepreg 30 from swelling out into the through holes 24 when the aluminum board 10 is glued to the resin board 20, as shown in FIG. 5(b).

Figure 6:
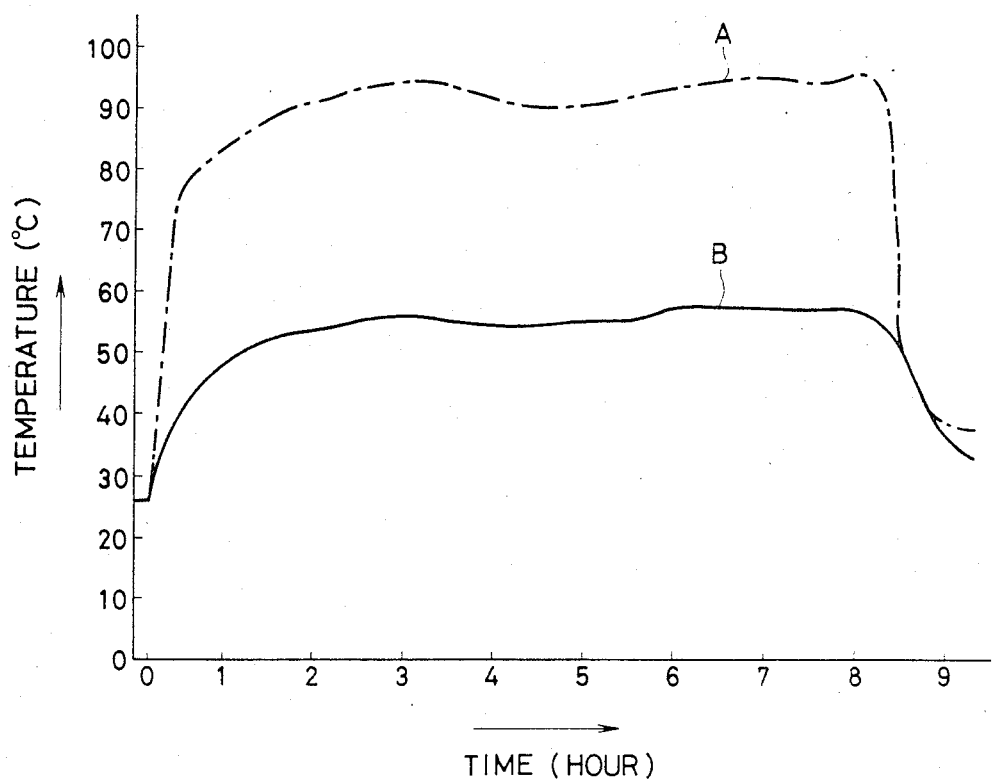
FIG. 6 is a graph exhibiting the relationship between the functioning time of the components mounted on the printed circuit board and the temperature of the printed circuit board.

As fully explained above, because of the excellent heat release capacity, the temperature of the printed circuit board under the present invention never gets higher, even though the component mounting density gets higher and the heat value generated from the mounted components gets larger. Summing up the above, FIG. 6 represents a graph exhibiting the relationship between the operating time of the mounted components and the temperature of the printed circuit board while the mounted components were put in operation for a consecutive eight hours The line A represents the case of a conventional printed circuit resin board, while the line B is the case of the printed circuit board of the present invention. As it is clear from this graph, the temperature of the printed circuit board under the present invention is kept quite lower than that of the conventional printed circuit resin board. For this reason, there is neither any functional deterioration in the components mounted on the printed circuit board of the present invention, nor any necessity for mounting such an expensive component as equipped with radiation fins or the like. Also, its larger flexural rigidity keeps the printed circuit board entirely free from any camber even if the number of the mounted components increases, so that it assures an easy insertion of the printed circuit board into the electronic system and prevents the printed circuit board from coming in contact with neighboring printed circuit boards. Furthermore, the improved shielding effect facilitates effectively prevention of noise that might be generated otherwise. Accordingly, it widely expands the applicable area of the printed circuit board. At the same time, since the method for manufacturing the printed circuit board of the present invention provides the lead wire holes at the very centers of the filled resin by the use of the identical hole position designating means, the lead wire holes can be provided with much ease at the very centers of the resin holes. As the precision in providing the positions of the lead wire holes is so high, the mounting of components on the printed circuit board can be performed by a automated component mounting machine without any trouble.

We claim:

1. A printed circuit board which consists of:
a metal board and a resin board glued together by a prepreg; said metal board having holes printed therein filled with resin and lead wire holes provided at the centers of said resin filled holes; said resin board being provided with at least one circuit layer and through holes, with centers of said lead wire holes and centers of said through holes being on identical lines, said prepreg not having holes therein corresponding to said holes in said metal and resin boards.

2. The printed circuit board of claim 1 in which said metal board is aluminum.

3. A method of manufacturing a printed circuit board which comprises providing holes in a metal board by a drilling machine or press machine with a hole position designating means, filling said holes with resin, providing lead wire holes at centers of said resin filled holes by a drilling machine with said hole position designating means, and providing a resin board having at least one circuit layer therein and through holes provided therethrough; said metal board and said resin board being glued together, keeping the centers of said lead wire holes and centers of said through holes on identical lines.

4. The method of claim 3 in which an NC tape is employed as said hole position designating means.

5. The method of claim 4 in which an NC drilling machine is employed as said drilling machine.

6. The method of claim 3 in which the surface of said metal board is roughened prior to providing said resin filled holes on said metal board.

7. The method of claim 3 in which said metal board and said resin board are glued together by a prepreg layer.

8. The method of claim 7 in which holes are formed in said prepreg layer corresponding to said holes in said metal board, simultaneously therewith.

9. The method of claim 7 in which a conductive circuit layer is formed in an area adjacent said through holes of said resin board on the side of said resin board where said metal board is glued.

10. The method of claim 7 in which said metal is aluminum.

* * * * *